United States Patent
Jang

Patent Number: 5,939,751
Date of Patent: Aug. 17, 1999

[54] MOSFET HAVING DOUBLE JUNCTION STRUCTURES IN EACH OF SOURCE AND DRAIN REGIONS

[75] Inventor: Kyeong Sik Jang, Kyoungki-do, Rep. of Korea

[73] Assignee: Hyundai Electronics Industries Co., Ltd., Rep. of Korea

[21] Appl. No.: 08/874,867

[22] Filed: Jun. 13, 1997

[30] Foreign Application Priority Data

Jun. 15, 1996 [KR] Rep. of Korea ............... 96-21712

[51] Int. Cl.$^6$ ................................................ H01L 29/72
[52] U.S. Cl. ............... 257/328; 257/335; 257/372; 257/386; 257/336; 257/344; 257/408; 257/900
[58] Field of Search ............................. 257/328, 335, 257/372, 386, 336, 344, 408–900

[56] References Cited

U.S. PATENT DOCUMENTS

| | | | |
|---|---|---|---|
| 4,851,360 | 7/1989 | Haken et al. | 437/29 |
| 5,108,935 | 4/1992 | Rodder | 437/24 |
| 5,264,719 | 11/1993 | Beasom | 257/335 |

FOREIGN PATENT DOCUMENTS

| | | | |
|---|---|---|---|
| 4-174561 | 6/1992 | Japan | 257/335 |
| 5-48091 | 2/1993 | Japan | 257/335 |

*Primary Examiner*—Edward Wojciechowicz
*Attorney, Agent, or Firm*—Blakely Sokoloff Taylor & Zafman

[57] ABSTRACT

Disclosed is a MOSFET with double source and drain regions. Each of the source and drain regions in the MOSFET is implemented by two impurity-implanted regions. The source region has an n+ type region and a p type region which is formed beneath the n+ type region. The drain region has a p type region and an n+ type region which is formed beneath the p type region. Accordingly, the high built-in potential is induced in the source region and then the leakage current may decrease. On the other hand, because a current path is formed from the n+ type region in the source region to the n+ type region in the drain region, the hot carrier effect is reduced.

8 Claims, 2 Drawing Sheets

MOSFET HAVING DOUBLE JUNCTION STRUCTURES IN EACH OF SOURCE AND DRAIN REGIONS

BACKGROUND OF THE INVENTION

1. Field of the Invention

The present invention relates to a semiconductor device with a double junction structure, and more specifically to a MOS transistor capable of reducing the hot carrier effect and the occurrence of junction leakage current in the source and drain regions.

2. Description of Related Art

In general, with the development of highly integrated circuits, there are various problems that must be solved. FIG.1 is a cross-sectional view illustrating a conventional MOSFET. In FIG. 1, reference numeral 1 denotes a silicon substrate, 2 a gate oxide layer, 3 a gate electrode, 4 a source region and 5 a drain region.

The driving voltage of semiconductor device may not decrease exactly in proportion to the scale down of the highly integrated device. Accordingly, an electric field applied to the drain region 4 may increase such that the device deteriorates due to the hot carriers generated in the depletion region in the drain region 4, and due to the leakage current between the source region 5 and the silicon substrate 1.

The hot carriers occur in the high electric field, such as nearby the drain region 4 of the field effect transistor and the gate insulating layer 2. If the hot carriers get higher energy than the potential barrier of the gate insulating layer, they are injected into the gate insulating layer and then trapped therein. The trapped hot carriers forming the space charges alter the device's characteristics, such as the threshold voltage of the device.

SUMMARY OF THE INVENTION

Therefore, an object of the present invention is to provide a semiconductor device capable of improving the reliability of the device by forming a double junction in each of the source and drain region and then separating the current path of the majority carriers.

In accordance with an aspect of the present invention, there is provided a semiconductor device comprising: a semiconductor substrate having a first conductivity type; a gate insulating layer formed on the semiconductor substrate; a gate electrode formed on the gate insulating layer; a first impurity-implanted region formed in a surface of the semiconductor substrate, wherein the first impurity-implanted region has a second conductivity type; a second impurity-implanted region formed beneath the first impurity-implanted region, wherein the second impurity-implanted region has the first conductivity type, and wherein an impurity concentration of the second impurity-implanted region is lower than that of the first impurity-implanted region; a third impurity-implanted region formed in the surface of the semiconductor substrate, wherein the third impurity-implanted region has the first conductivity type and wherein the third impurity-implanted region is laterally spaced apart from the first impurity-implanted region by a length of the gate electrode; a fourth impurity-implanted region formed beneath the third impurity-implanted region, wherein the fourth impurity-implanted region has the second conductivity type, and wherein an impurity concentration of the fourth impurity-implanted region is higher than that of the third impurity-implanted region, such that majority carriers move from the first impurity-implanted region to the fourth impurity-implanted region and a fourth impurity-implanted region formed beneath the third impurity-implanted region, wherein the fourth impurity-implanted region has the same impurity type as the first impurity-implanted region, and wherein an impurity concentration of the fourth impurity-implanted region is higher than that of the third impurity-implanted region, whereby majority carriers move from the first impurity-implanted region to the fourth impurity-implanted region.

In accordance with another aspect of the present invention, there is provided a semiconductor device comprising: a semiconductor substrate having a first conductivity type; a gate insulating layer formed on the semiconductor substrate; a gate electrode formed on the gate insulating layer; a source region made of a highly doped region formed in a surface of the semiconductor substrate, wherein the source region has a second conductivity type; a first impurity-implanted region formed beneath the source region, wherein the first impurity-implanted region has the first conductivity type, and wherein an impurity concentration of the first impurity-implanted region is lower than that of the source region; a second impurity-implanted region formed in the surface of the semiconductor substance, wherein second impurity-implanted region has the first conductivity type, and wherein the second impurity-implanted region is laterally spaced apart from a drain region by a length of the gate electrode; and the drain region formed beneath the second impurity-implanted region, wherein the drain region has a second conductivity type, and wherein an impurity concentration of the drain region is higher than that of the second impurity-implanted region.

BRIEF DESCRIPTION OF THE DRAWINGS

Other objects and aspects of the invention will become apparent from the following description of the embodiments with reference to the accompanying drawings, in which.

DETAILED DESCRIPTION OF THE INVENTION

Hereinafter, the present invention will be described in detail referring to the accompanying drawings.

Figure 1:
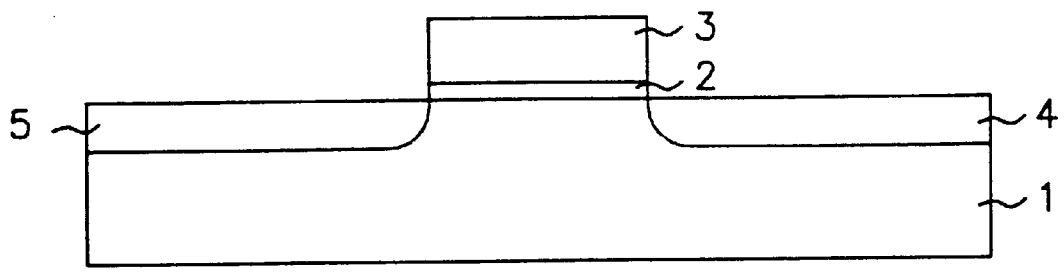
FIG. 1 is a cross-sectional view illustrating a conventional MOSFET.
Figure 2:
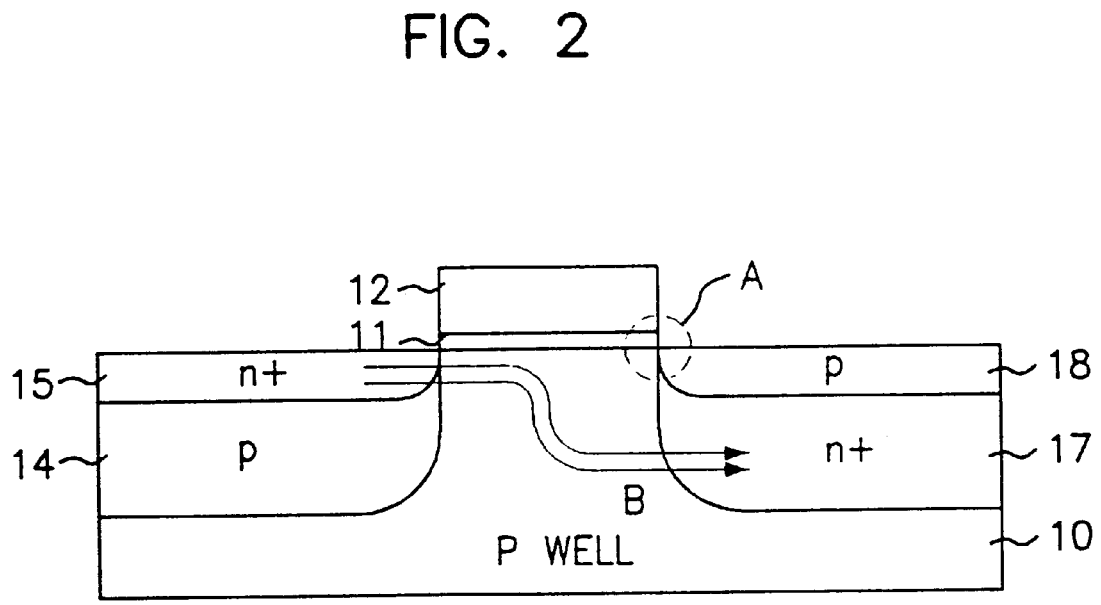
FIG. 2 is a cross-sectional view illustrating a NMOSFET in accordance with an embodiment of the present invention.

FIG. 2 is a cross-sectional view illustrating a double junction N-channel MOSFET (hereinafter, referred to as an NMOSFET) in accordance with an embodiment of the present invention.

As shown in FIG. 2, the NMOSFET includes a gate insulating layer 11 and a gate electrode 12, which are formed on a semiconductor substrate 10, and source and drain regions which are formed at both ends of gate electrode 12 in the substrate 10. The above source region is formed with an n+ type source region 15 and a p type source region 14 that is formed beneath the n+ type source region 15. Also, the drain region is formed with a p type drain region 18 and an n+ type drain region 17 that is formed beneath p type drain region 18.

In the NMOSFET according to an embodiment of the present invention, the high electric field region A in the drain region is spaced apart from the current path B in which the majority carriers move from the source region to the drain region.

The majority carriers don't pass through the high electric field region, and therefore the reliability of device may be improved. Further, because the n+ type source region 15 doesnt'share borders with the substrate 10, but shares borders with the p type source region 14 which has higher impurity concentration than the substrate 10, a high built-in potential is induced and then the leakage current may decrease.

Figure 3A:
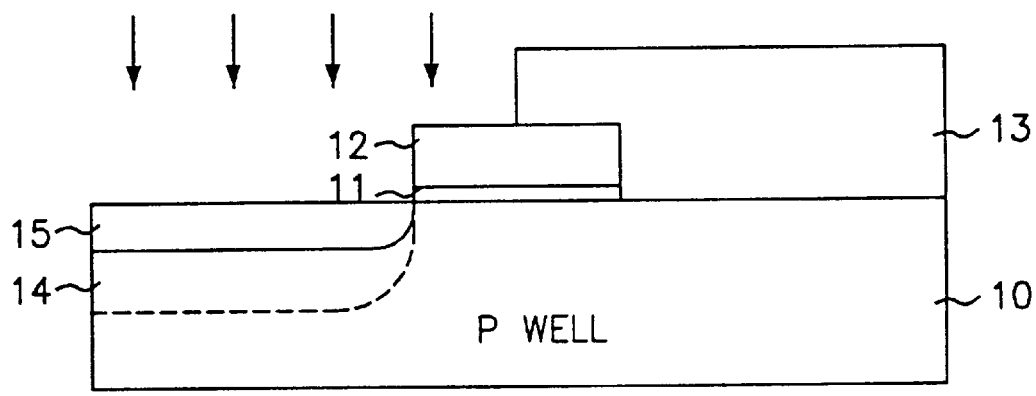
FIGS. 3A and 3B are cross-sectional views illustrating a method for fabricating the NMOSFET in accordance with an embodiment of the present invention.

FIG. 3 shows a method for fabricating the NMOSFET in accordance with an embodiment of the present invention. Referring to the FIG. 3A, the gate insulating layer 11 and the gate electrode 12 are formed on the p type semiconductor substrate by a conventional transistor manufacturing processes. A photoresist layer is deposited on the substrate and a photoresist pattern 13 exposing the source region is formed by carrying out the selective exposure and development processes.

P type impurity ions are implanted into the exposed substrate energy, so the p type source region 14 is formed with a deep junction depth. Also, n+ type impurity ions are implanted into the same region with low level energy, and then the n+ type source region 15 is formed with the shallow junction on the p type source region 14.

Figure 3B:
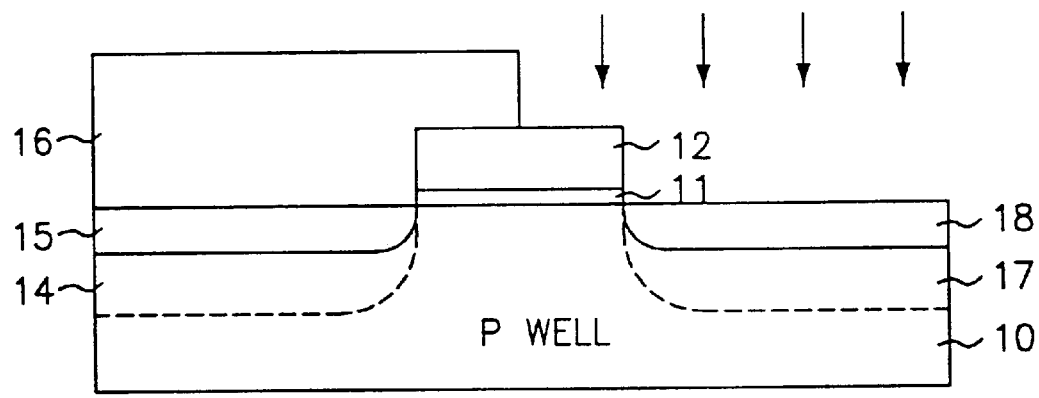

Next, as shown in FIG. 3B, after removing the photoresist pattern 13, a photoresist layer is deposited again and a photoresist pattern 16 is selectively formed, exposing the drain region. Then n+ type impurity ions are implanted into the exposed substrate with high level energy, so that an n+ type drain region 17 is formed. Also, p type impurity ions are implanted into the substrate with low level energy so that a p type drain region 18 is formed with shallow junction on the n+ type drain region 17. Then these complete the NMOSFET with double junction structure.

On the other hand, in case of a P-channel using n type substrate instead of a p type substrate, both the first and second source regions and the first and second drain regions are formed with impurities different from those implanted into the NMOSFET.

As apparent from above, the present invention improves the electrical characteristics of the device by spacing apart the high-electric field region from the moving path of the majority carriers and also the patent invention can decrease the leakage current by increasing built-in potential in the source region without the LDD (lightly doped drain) structure or pocket structure adopted to improve the characteristics of the device using the LDD mask or the pocket mask. The present invention is simple since it can manufacture the device with only a mask to form the source and drain regions.

Although specific embodiments of the present invention are herein described, they are not to be constructed as limiting the scope of the invention. Many embodiments of the present invention will become clear to those skilled in the art in light of the methodology of the specification. The scope of the invention is limited only by the claims appended.

What is claimed is:

1. A semiconductor device comprising:

a semiconductor substrate having a first conductivity type:

a gate insulating layer formed on the semiconductor substrate;

a gate electrode formed on the gate insulating layer;

a first impurity-implanted region formed in a surface of the semiconductor substrate, wherein the first impurity-implanted region has a second conductivity type;

a second impurity-implanted region formed beneath the first impurity-implanted region, wherein the second impurity-implanted region has the first conductivity type, and wherein an impurity concentration of the second impurity-implanted region is lower than that of the first impurity-implanted region;

a third impurity-implanted region formed in the surface of the semiconductor substrate, wherein the third impurity-implanted region has the first conductivity type and wherein the third impurity-implanted region is laterally spaced apart from the first impurity-implanted region by a length of the gate electrode;

a fourth impurity-implanted region formed beneath the third impurity-implanted region, wherein the fourth impurity-implanted region has the second conductivity type, and wherein an impurity concentration of the fourth impurity-implanted region is higher than that of the third impurity-implanted region, such that majority carriers move from the first impurity-implanted region to the fourth impurity-implanted region.

2. A semiconductor device in accordance with claim 1, wherein a depth from a surface of the second impurity-implanted region to a bottom of the second impurity-implanted region is deeper than that from the surface of the semiconductor substrate to a bottom of the first impurity-implanted region.

3. A semiconductor device in accordance with claim 2, wherein a depth from a surface of the fourth impurity-implanted region to a bottom of the fourth impurity-implanted region is deeper than that from the surface of the semiconductor substrate to a bottom of the third impurity-implanted region.

4. A semiconductor device in accordance with claim 3, wherein an impurity concentration of the second impurity-implanted region is higher than that of a well of the semiconductor substrate.

5. A semiconductor device comprising:

a semiconductor substrate having a first conductivity type;

a gate insulating layer formed on the semiconductor substrate;

a gate electrode formed on the gate insulating layer;

a source region made of a highly doped region formed in a surface of the semiconductor substrate, wherein the source region has a second conductivity type;

a first impurity-implanted region formed beneath the source region, wherein the first impurity-implanted region has the first conductivity type, and wherein an impurity concentration of the first impurity-implanted region is lower than that of the source region;

a second impurity-implanted region formed in the surface of the semiconductor substance, wherein second impurity-implanted region hag the first conductivity type, and wherein the second impurity-implanted region is laterally spaced apart from a drain region by a length of the gate electrode; and the drain region formed beneath the second impurity-implanted region wherein the drain region has a second conductivity type, and wherein an impurity concentration of the drain region is higher than that of the second impurity-implanted region.

6. A semiconductor device in accordance with claim 5, wherein a depth from a surface of the first impurity-implanted region to a bottom of the first impurity-implanted region is deeper than that of a depth from the surface of the semiconductor substrate to a bottom of the source region.

7. A semiconductor device in accordance with claim 6, wherein a depth from a surface of the drain region to a bottom of the drain region is deeper than that of a depth from a surface of the surface of the semiconductor substrate to a bottom of the second impurity-implanted region.

8. A semiconductor device in accordance with claim 7, wherein an impurity concentration of the first impurity-implanted region is higher than that of a well of the semiconductor substrate.

* * * * *

UNITED STATES PATENT AND TRADEMARK OFFICE
CERTIFICATE OF CORRECTION

PATENT NO.   : 5,939,751
DATED        : August 17, 1999
INVENTOR(S)  : Jang

It is certified that error appears in the above-identified patent and that said Letters Patent is hereby corrected as shown below:

Column 2,
Line 2, delete "and a fourth impurity-implanted region formed beneath the third impurity-implanted region, wherein the fourth impurity-implanted region has the same impurity type as the first impurity-implanted region, and wherein an impurity concentration of the fourth impurity-implanted region is higher than that of the third impurity-implanted region, whereby majority carriers move from the first impurity-implanted region to the fourth impurity-implanted region."and insert -- . --.

Column 3,
Line 7, delete "doesn't' share borders" and insert -- doesn't share borders --.

Column 4,
Line 56, delete "region hag the first" and insert -- region has the first --.

Signed and Sealed this

Twenty-first Day of August, 2001

Attest:

NICHOLAS P. GODICI
*Attesting Officer*   *Acting Director of the United States Patent and Trademark Office*